US011581247B2

(12) United States Patent
Ishii

(10) Patent No.: US 11,581,247 B2
(45) Date of Patent: Feb. 14, 2023

(54) SEMICONDUCTOR DEVICE RESISTANT TO THERMAL CRACKING AND MANUFACTURING METHOD THEREOF

(71) Applicant: Mitsubishi Electric Corporation, Tokyo (JP)

(72) Inventor: Ryuichi Ishii, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 11 days.

(21) Appl. No.: 17/187,961

(22) Filed: Mar. 1, 2021

(65) Prior Publication Data
US 2022/0115300 A1 Apr. 14, 2022

(30) Foreign Application Priority Data

Oct. 8, 2020 (JP) .............................. JP2020-170236

(51) Int. Cl.
*H01L 23/495* (2006.01)
*H01L 23/31* (2006.01)
(Continued)

(52) U.S. Cl.
CPC ...... *H01L 23/49537* (2013.01); *H01L 21/565* (2013.01); *H01L 23/3114* (2013.01);
(Continued)

(58) Field of Classification Search
CPC ....... H01L 21/565; H01L 24/33; H01L 24/83; H01L 23/36; H01L 23/367; H01L 23/373;
(Continued)

(56) References Cited

U.S. PATENT DOCUMENTS 7,602,050 B2 * 10/2009 Sharma ............. H01L 23/49531
257/676
9,620,440 B1 * 4/2017 Shibuya ............. H01L 21/4828
(Continued)

FOREIGN PATENT DOCUMENTS

JP 2008-016529 A 1/2008
JP 2012-089563 A 5/2012
(Continued)

OTHER PUBLICATIONS

Office Action dated Dec. 21, 2021 from the Japanese Patent Office in JP Application No. 2020-170236.

*Primary Examiner* — Khiem D Nguyen
(74) *Attorney, Agent, or Firm* — Sughrue Mion, PLLC; Richard C. Turner

(57) ABSTRACT

The semiconductor device includes: a heat spreader; a semiconductor element joined to the heat spreader via a first joining member; a first lead frame joined to the heat spreader via a second joining member; a second lead frame joined to the semiconductor element via a third joining member; and a mold resin. In a cross-sectional shape obtained by cutting at a plane perpendicular to a one-side surface of the heat spreader, an angle on the third joining member side out of two angles formed by a one-side surface of the semiconductor element and a straight line connecting an end point of a joining surface between the third joining member and the semiconductor element and an end point of a joining surface between the third joining member and the second lead frame, is not smaller than 90° and not larger than 135°.

10 Claims, 8 Drawing Sheets

(51) Int. Cl.
*H01L 23/00* (2006.01)
*H01L 21/56* (2006.01)

(52) U.S. Cl.
CPC .............. *H01L 24/33* (2013.01); *H01L 24/83* (2013.01); *H01L 2224/33181* (2013.01); *H01L 2224/8321* (2013.01); *H01L 2924/3511* (2013.01)

(58) Field of Classification Search
CPC ......... H01L 23/49575; H01L 23/49579; H01L 23/49582
USPC ........................................................ 257/666
See application file for complete search history.

(56) References Cited

U.S. PATENT DOCUMENTS

| 2016/0172275 | A1* | 6/2016 | Marchisi | H01L 25/50 438/112 |
| 2016/0315054 | A1* | 10/2016 | Kajihara | H01L 23/562 |
| 2018/0269140 | A1* | 9/2018 | Tada | H01L 23/3121 |
| 2019/0172815 | A1* | 6/2019 | Wang | H01L 23/49575 |
| 2019/0252299 | A1* | 8/2019 | Kamiyama | H01L 23/49524 |
| 2019/0378785 | A1* | 12/2019 | Muto | H01L 25/50 |

FOREIGN PATENT DOCUMENTS

| JP | 2013-161941 A | 8/2013 |
| JP | 2018-129455 A | 8/2018 |
| WO | 2016/125419 A1 | 8/2016 |
| WO | 2019/049215 A1 | 3/2019 |

\* cited by examiner

SEMICONDUCTOR DEVICE RESISTANT TO THERMAL CRACKING AND MANUFACTURING METHOD THEREOF

BACKGROUND OF THE INVENTION

1. Field of the Invention

The present disclosure relates to a semiconductor device and a semiconductor device manufacturing method.

2. Description of the Background Art

Increase in the capacities of semiconductor devices mounted with semiconductor elements for power has been progressing in recent years. In order to cause large current to flow to a semiconductor element, it is necessary to upsize a lead frame serving as a main terminal joined to the semiconductor element via a joining member. The upsizing of the lead frame leads to increase in thermal deformation force that is generated to the semiconductor element owing to the difference in linear expansion coefficient among the semiconductor element, the lead frame, and the joining member. Increase in the thermal deformation force may lead to occurrence of a crack in the semiconductor element. In order to reduce the thermal deformation force, many structures in which a semiconductor element, a lead frame, and a joining member are sealed by a resin have been employed in general.

As semiconductor devices in which a semiconductor element, a lead frame, and a joining member are sealed by a resin, transfer-mold-type semiconductor devices in which sealing is performed by a thermosetting mold resin such as epoxy resin, and gel-sealed-type semiconductor devices in which sealing is performed by a gelatinous resin, are used. In particular, transfer-mold-type semiconductor devices are small-sized and have excellent reliability, and thus are widely used for power control and the like.

In addition to structures in which a semiconductor element, a lead frame, and a joining member are sealed by a mold resin, a structure is disclosed in which the thickness of an electrode of a main terminal joined to a semiconductor element is made partially small to further suppress occurrence of a crack in the semiconductor element (see, for example, Patent Document 1). If the thickness of the electrode of the main terminal joined to the semiconductor element is made partially small, the thermal deformation force that is generated to the semiconductor element is reduced, whereby occurrence of a crack in the semiconductor element can be further suppressed.

Patent Document 1: Japanese Laid-Open Patent Publication No. 2008-16529

In the above-described Patent Document 1, occurrence of a crack in the semiconductor element due to the thermal deformation force generated to the semiconductor element can be further suppressed. However, since the thickness of the electrode of the main terminal joined to the semiconductor element is made partially small, a problem arises in that the structure of the main terminal is complicated, and it is difficult to downsize, and reduce cost for, the semiconductor device. In addition, in the case where two or more semiconductor elements are mounted inside a resin-sealed-type semiconductor device, a problem arises in that the structure of the electrode of the main terminal is more complicated and upsized, and it is more difficult to downsize, and reduce cost for, the semiconductor device.

SUMMARY OF THE INVENTION

Considering this, an object of the present disclosure is to obtain a resin-sealed-type semiconductor device that is downsized and requires reduced cost therefor while easily suppressing occurrence of a crack in a semiconductor element.

A semiconductor device according to the present disclosure includes: a heat spreader formed in a plate shape; a semiconductor element formed in a plate shape and joined, to a one-side surface of the heat spreader, at an other-side surface of the semiconductor element via a first joining member; a first lead frame joined, at an other-side surface thereof, to the one-side surface of the heat spreader via a second joining member; a second lead frame joined, at an other-side surface thereof, to a one-side surface of the semiconductor element via a third joining member; and a mold resin sealing the heat spreader, the semiconductor element, the first lead frame, and the second lead frame such that a portion of the first lead frame and a portion of the second lead frame are exposed to outside. A boundary between the third joining member and the mold resin is present in a gap between the one-side surface of the semiconductor element and the other-side surface of the second lead frame. In a cross-sectional shape obtained by cutting a portion around the boundary at a plane perpendicular to the one-side surface of the heat spreader, an angle on the third joining member side out of two angles formed by the one-side surface of the semiconductor element and a straight line connecting an end point of a joining surface between the third joining member and the semiconductor element and an end point of a joining surface between the third joining member and the second lead frame, is not smaller than 90° and not larger than 135°.

In the semiconductor device according to the present disclosure, in the cross-sectional shape obtained by cutting the portion around the boundary between the third joining member and the mold resin at a plane perpendicular to the one-side surface of the heat spreader, the angle on the third joining member side out of the angles formed by the one-side surface of the semiconductor element and the straight line connecting the end point of the joining surface between the third joining member and the semiconductor element and the end point of the joining surface between the third joining member and the second lead frame, is not smaller than 90° and not larger than 135°. Thus, it is possible to reduce a maximum stress at a maximum stress generation portion of the semiconductor element without complicating or upsizing the structure of the second lead frame which is a main terminal. Therefore, it is possible to downsize, and reduce cost for, the resin-sealed-type semiconductor device while easily suppressing occurrence of a crack in the semiconductor element.

DETAILED DESCRIPTION OF THE PREFERRED EMBODIMENTS OF THE INVENTION

Figure 1:
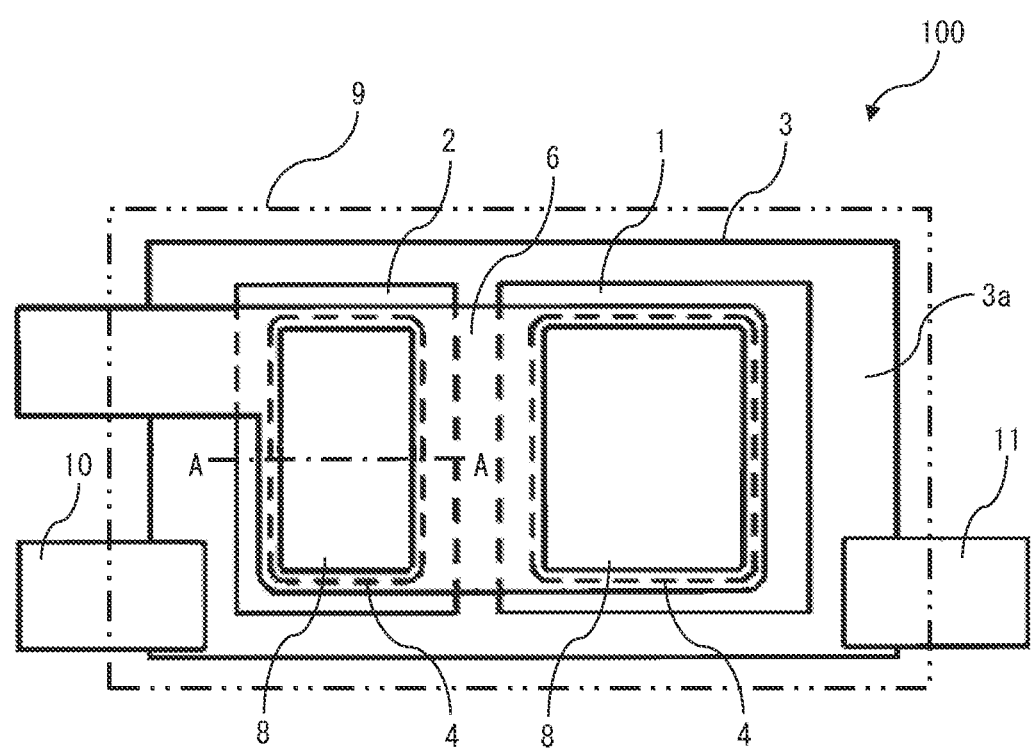
FIG. 1 is a plan view schematically showing a semiconductor device according to a first embodiment.

Hereinafter, semiconductor devices according to embodiments of the present disclosure will be described with reference to the drawings. It is noted that description will be given while the same or corresponding members and portions in the drawings are denoted by the same reference characters.

First Embodiment

Figure 2:
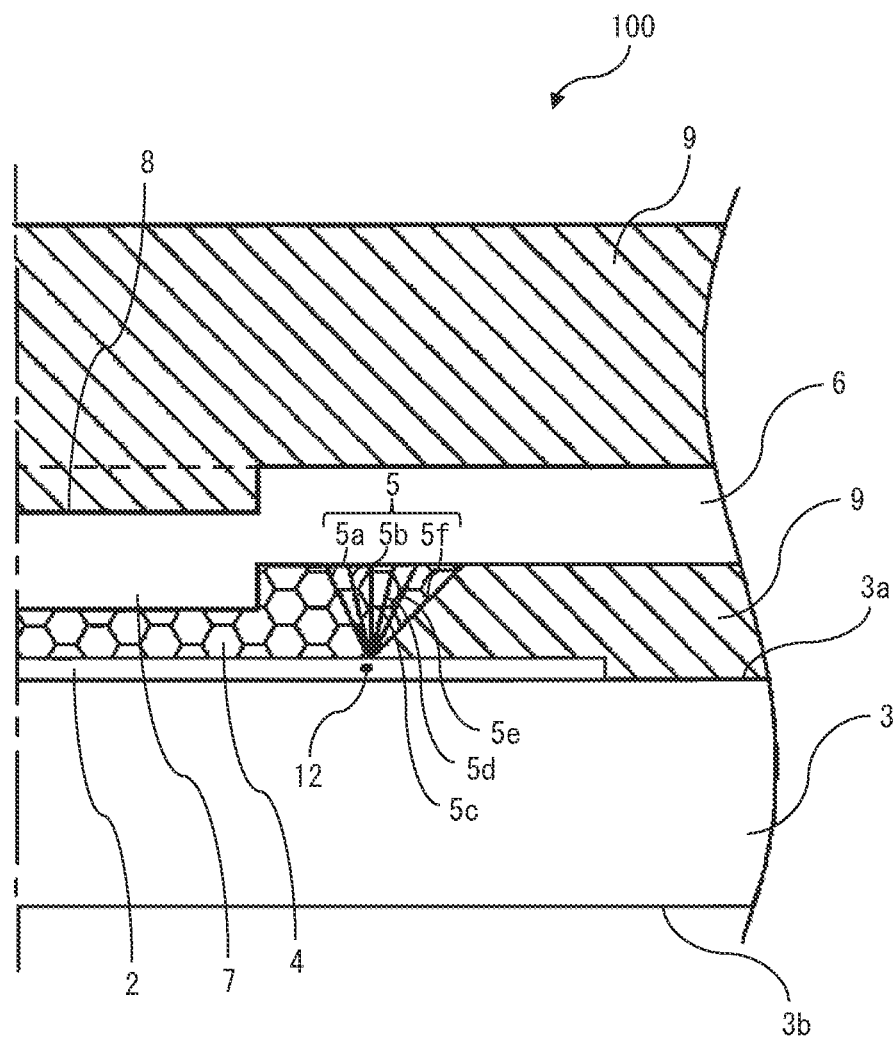
FIG. 2 is a major-part cross-sectional view of the semiconductor device taken at the cross-sectional position A-A in FIG. 1.
Figure 3:
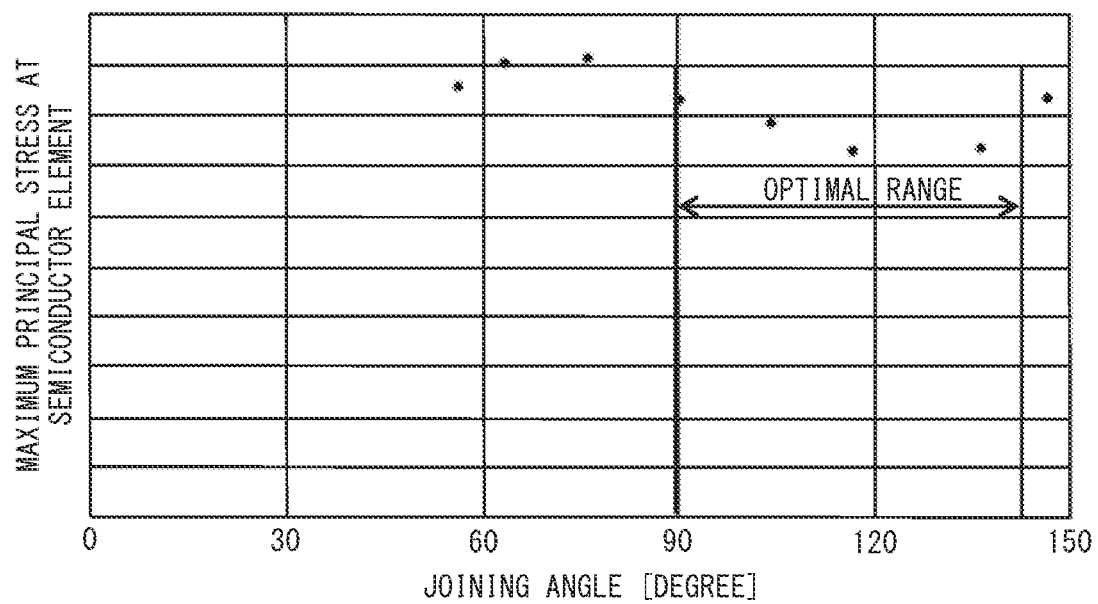
FIG. 3 is a diagram in which maximum stresses generated at a semiconductor element are shown with respect to joining angle.
Figure 4:
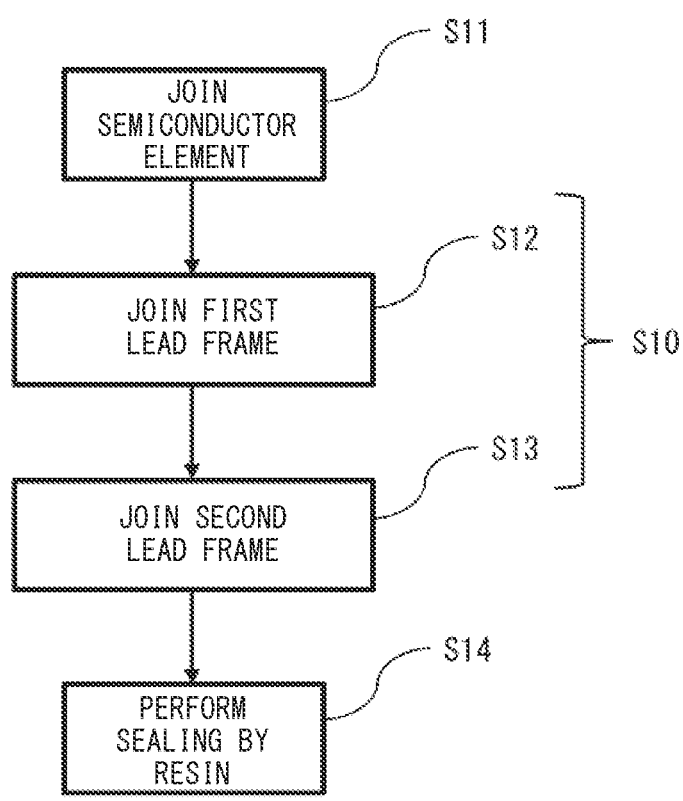
FIG. 4 is a diagram showing a manufacturing process for the semiconductor device according to the first embodiment.
Figure 5:
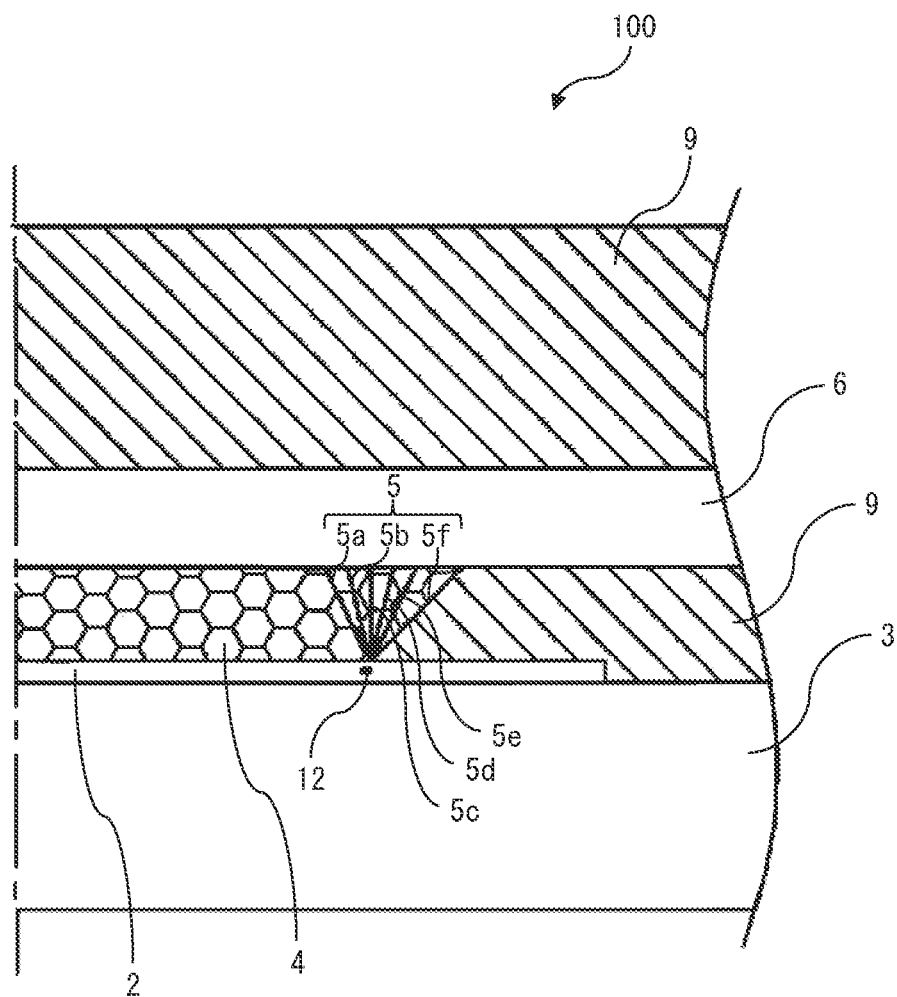
FIG. 5 is a major-part cross-sectional view schematically showing another semiconductor device according to the first embodiment.

FIG. 1 is a plan view schematically showing a semiconductor device 100 according to a first embodiment. FIG. 2 is a major-part cross-sectional view of the semiconductor device 100 taken at the cross-sectional position A-A in FIG. 1. FIG. 3 is a diagram in which values of maximum stress generated at a maximum stress generation portion 12 of a semiconductor element 2 are shown with respect to joining angle 5. FIG. 4 is a diagram showing a manufacturing process for the semiconductor device 100. FIG. 5 is a major-part cross-sectional view schematically showing another semiconductor device 100 according to the first embodiment. FIG. 1 is a view in which a mold resin 9 is excluded, and the alternate long and two short dashes line indicates the contour of the mold resin 9. FIG. 2 and FIG. 5 are views in which the mold resin 9 is also included. Since the semiconductor device 100 is configured to be right-left symmetric about the cross-sectional position A-A in FIG. 1, FIG. 2 shows only the right-side portion relative to the cross-sectional position A-A. The cross section at the cross-sectional position A-A in FIG. 2 includes the semiconductor element 2, and the same configuration applies also to a cross section including a semiconductor element 1 disposed to be adjacent to the semiconductor element 2 in FIG. 1. These drawings are schematic, and a dimensional relationship therein is different from the actual dimensional relationship between components of the semiconductor device 100. The semiconductor device 100 is a resin-sealed-type semiconductor device 100 in which the semiconductor elements 1 and 2 are sealed by the mold resin 9. The semiconductor device 100 is used for, for example, power control.

<Semiconductor Device 100>

The semiconductor device 100 includes: the semiconductor elements 1 and 2 each formed in a plate shape; a heat spreader 3 formed in a plate shape; first lead frames 10 and 11; a second lead frame 6; and the mold resin 9. For example, the semiconductor element 1 is a switching element, and the semiconductor element 2 is a rectification element. Although these two semiconductor elements 1 and 2 are provided in the present embodiment, the number of semiconductor elements included in the semiconductor device 100 is not limited to two, and the number of semiconductor elements may be one or may be three or more according to use of the semiconductor device 100 or the like. In addition, although the semiconductor elements 1 and 2 are each a vertical-structure semiconductor including an electrode pad (not shown) on each of a one-side surface and an other-side surface thereof, the semiconductor elements 1 and 2 are not limited to the vertical-structure semiconductors and may each be a horizontal-structure semiconductor element including an electrode pad only on a one-side surface thereof.

Each of the semiconductor elements 1 and 2 is joined, at the other-side surface thereof, to a one-side surface 3a of the heat spreader 3 via an under-chip joining member (not shown) which is a first joining member. Each of the first lead frames 10 and 11 is joined, at an other-side surface thereof, to the one-side surface 3a of the heat spreader 3 via a lead joining member (not shown) which is a second joining member. The second lead frame 6 is joined, at an other-side surface thereof, to an electrode pad which is an active surface portion of the one-side surface of each of the semiconductor elements 1 and 2 via an over-chip joining member 4 which is a third joining member. The mold resin 9 seals the heat spreader 3, the semiconductor elements 1 and 2, the first lead frames 10 and 11, and the second lead frame 6 such that portions of the first lead frames 10 and 11 and a portion of the second lead frame 6 are exposed to outside. The under-chip joining member, the over-chip joining member 4, and the lead joining member are also sealed by the mold resin 9. The semiconductor elements 1 and 2 are connected to outside of the semiconductor device 100 via the first lead frames 10 and 11 and the second lead frame 6 which are exposed to outside.

The semiconductor element 1 is a switching element that performs power conversion through a switching operation, such as an IGBT (Insulated Gate Bipolar Transistor) or an MOSFET (Metal-Oxide-Semiconductor Field Effect Transistor). The IGBT causes large current to flow to a load, to drive the load. The semiconductor element 2 is a rectification element such as a flyback diode. A material of the semiconductor elements 1 and 2 is, for example, silicon (Si). The material of the semiconductor elements 1 and 2 is not limited to silicon and may be, for example, a material selected from the group consisting of silicon carbide (SiC), gallium nitride-based materials such as gallium nitride (GaN), and diamond. These are so-called wide bandgap semiconductor materials having wider bandgaps than silicon. In the case where the semiconductor elements 1 and 2 are formed of a wide bandgap semiconductor material, the semiconductor elements 1 and 2 can be operated at a higher temperature than semiconductor elements formed of silicon. That is, wide bandgap semiconductor materials are semiconductor materials that are suitable for causing large current to flow. In addition, in the case of using wide bandgap semiconductors, the wide bandgap semiconductors have high allowable current densities and low power losses, and thus the semiconductor device 100 can be downsized. It is noted that a semiconductor element formed of silicon and a wide bandgap semiconductor may be provided together in the semiconductor device 100.

The heat spreader 3, the first lead frames 10 and 11, and the second lead frame 6 are each made of a metal having excellent electric conductivity and thermal conductivity by, for example, cutting or press working. Among metals having good electric conductivities, a copper material such as pure copper or a copper alloy containing copper as a main component is most suitable as a material thereof from the viewpoints of electric resistance, workability, cost, and the like. An other-side surface 3b of the heat spreader 3 is not sealed by the mold resin 9 and is exposed to outside. Heat generated from the semiconductor elements 1 and 2 is dissipated from the other-side surface 3b to outside. The first lead frames 10 and 11 serving as input/output terminals are connected to the electrode pads on the other-side surface sides of the semiconductor elements 1 and 2 via the heat spreader 3. The second lead frame 6 serving as a main terminal is connected to a load outside of the semiconductor device 100. Protruding portions 7 respectively protruding toward the semiconductor elements 1 and 2 are formed at the other-side surface of the second lead frame 6. In some embodiments, a protruding portion 7 is a parallelepiped, and the third joining member 4 extends beyond an endpoint of the protruding portion 7 in a direction toward the maximum stress generation portion 12 of the semiconductor element 2. See FIG. 2. In the case where the protruding portions 7 are formed at the second lead frame 6 by embossing, the protruding portions 7 can be easily formed at the other-side surface of the second lead frame 6. In addition, in the case where the protruding portions 7 are formed by embossing, step recess portions 8 are formed in a one-side surface of the second lead frame 6. The reason for providing the protruding portions 7 will be described later.

A thermosetting resin material is used for the mold resin 9 and may be, for example, an epoxy resin filled with a hard inorganic powder of fused silica having a low thermal expansion coefficient or the like. The mold resin 9 does not need to be highly thermally conductive. Thus, among silicon oxides (silicas) that allow easy adjustment of linear expansion coefficients and that have good fluidity when contained in the thermosetting resin, fused silica is most suitable as the inorganic filler to be contained in the thermosetting resin. Although the epoxy resin is dependent on the heat dissipation property, the heat generation amount at the time of operation, and the operation temperature of the semiconductor device 100, a generally-used bisphenol-type epoxy resin, phenol-novolac-type epoxy resin, or the like may be used as the epoxy resin. It is noted that the material of the mold resin 9 is not limited to these materials if the semiconductor elements 1 and 2 can be sealed and protected by the material. For example, a highly thermally resistant resin in which a naphthalene-type or multifunctional-type material is used may be used as the mold resin 9 in association with increase in the operation temperatures of the semiconductor elements 1 and 2.

A resin that has a linear expansion coefficient approximate to the linear expansion coefficients of the heat spreader 3, the first lead frames 10 and 11, and the second lead frame 6 is preferably used as the mold resin 9 so as to prevent increase in thermal deformation force that is generated to the semiconductor elements 1 and 2 owing to the difference in linear expansion coefficient among the mold resin 9, the heat spreader 3, the first lead frames 10 and 11, and the second lead frame 6. In the case where the heat spreader 3, the first lead frames 10 and 11, and the second lead frame 6 are formed of pure copper, since pure copper has a linear expansion coefficient of 16 [ppm/K] to 17 [ppm/K], the linear expansion coefficient of the mold resin 9 is desirably within a range of 15 [ppm/K] to 18 [ppm/K] made approximate to the linear expansion coefficient of pure copper. The linear expansion coefficient of the mold resin 9 can be changed by adjusting the amount of the inorganic filler. If the linear expansion coefficient of the mold resin 9 is adjusted to be approximate to the linear expansion coefficient of pure copper, thermal deformation force inside the semiconductor device 100 can be reduced, and thus the reliability of the semiconductor device 100 with respect to a temperature cycle can be improved.

Each under-chip joining member is preferably a joining member selected from the group consisting of: solder joining members, sinterable fillers containing silver as a main component, brazing materials containing silver as a main component, materials obtained by dispersing copper in tin, and gold-based alloys such as gold-tin alloys and gold-germanium alloys which contain gold as a main component. These joining members have high thermal conductivities and electric conductivities and thus allow the heat spreader 3 and the semiconductor elements 1 and 2 to be thermally and electrically connected to each other. As the lead joining members, for example, solder joining members are used for ensuring electrical conduction between the heat spreader 3 and the first lead frames 10 and 11. As the over-chip joining members 4, for example, solder joining members are used for ensuring electrical conduction between the second lead frame 6 and the semiconductor elements 1 and 2. If the over-chip joining members 4 have low strengths, cracks occur in the over-chip joining members 4. Thus, in the case of using solder joining members as the over-chip joining members 4, solder joining members that are high-strength members having tensile strengths not lower than about 40 MPa are most suitable as the over-chip joining members 4.

COMPARATIVE EXAMPLE

Figure 6:
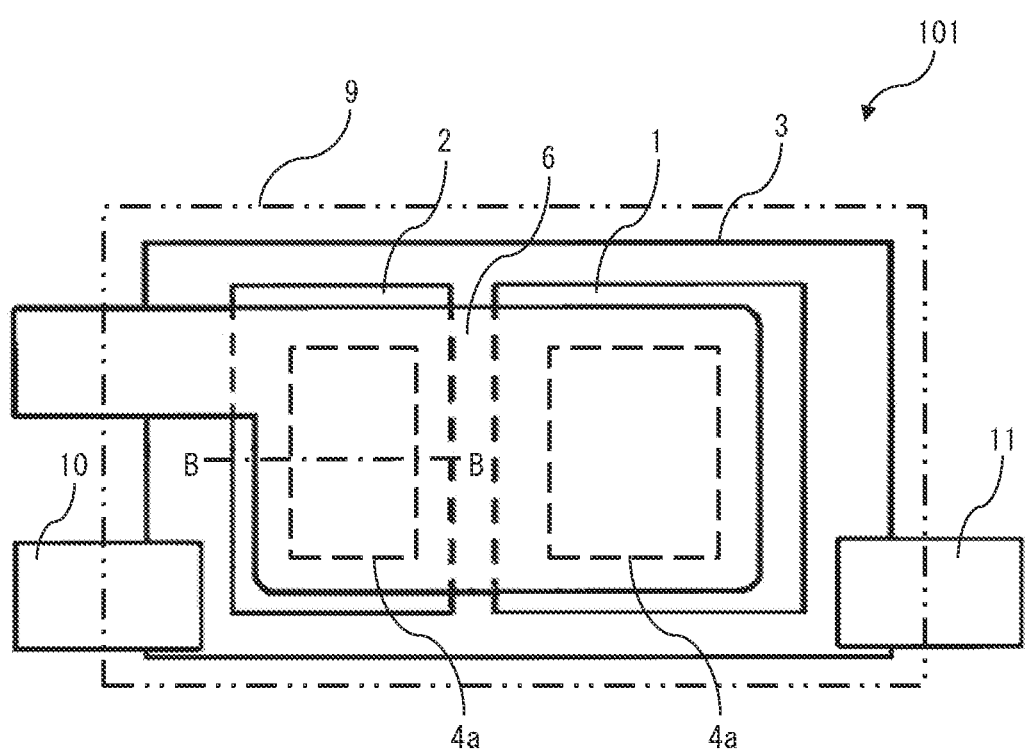
FIG. 6 is a plan view for explaining a semiconductor device in a comparative example.
Figure 7:
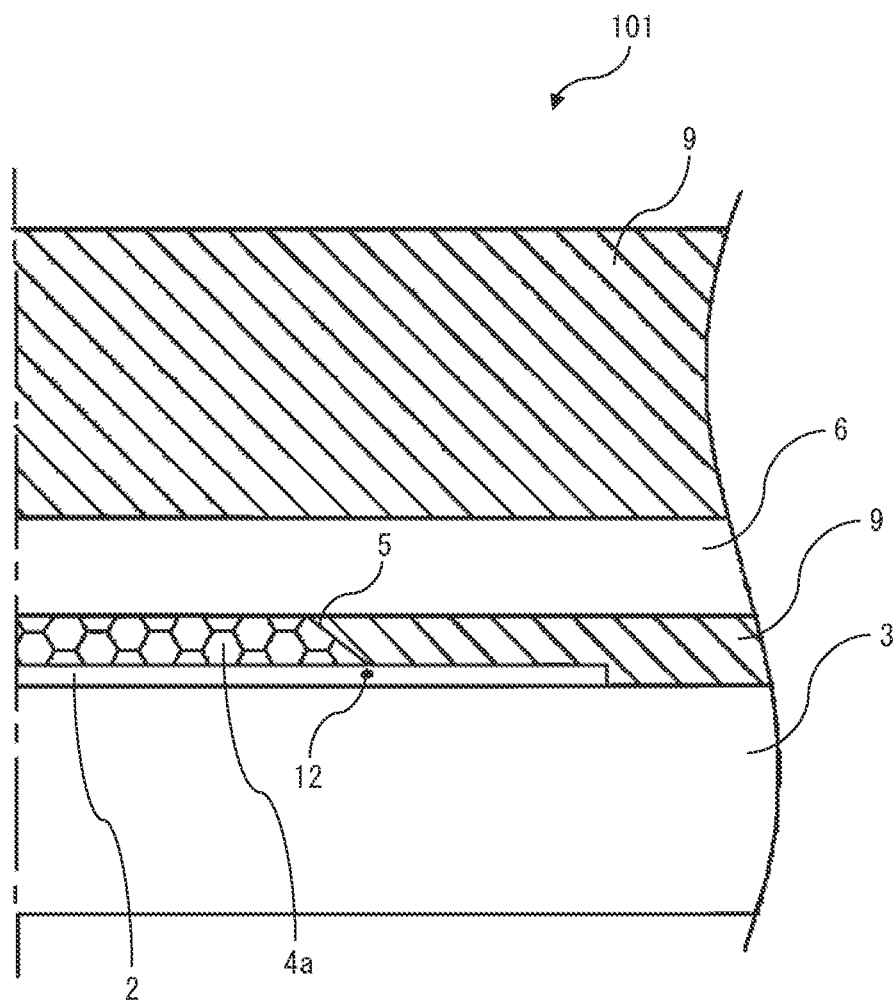
FIG. 7 is a cross-sectional view for explaining the semiconductor device in the comparative example.

A comparative example will be described with reference to FIG. 6 and FIG. 7 before the configurations of the over-chip joining members 4 which are major parts of the present disclosure are described. FIG. 6 is a plan view schematically showing a semiconductor device 101 in the comparative example. FIG. 7 is a cross-sectional view for explaining the semiconductor device 101 in the comparative example, and is a major-part cross-sectional view of the semiconductor device 101 taken at the cross-sectional position B-B in FIG. 6. FIG. 6 is a view in which the mold resin 9 is excluded, and the alternate long and two short dashes line indicates the contour of the mold resin 9. FIG. 7 is a view in which the mold resin 9 is also included. Since the semiconductor device 101 is configured to be right-left symmetric about the cross-sectional position B-B in FIG. 6, FIG. 7 shows only the right-side portion relative to the cross-sectional position B-B. The cross section at the cross-sectional position B-B in FIG. 7 includes the semiconductor element 2, and the same configuration applies also to a cross section including the semiconductor element 1 disposed to be adjacent to the semiconductor element 2 in FIG. 6. The semiconductor device 101 includes the semiconductor elements 1 and 2, the heat spreader 3, the first lead frames 10 and 11, the second lead frame 6, and the mold resin 9 in the same manner as the semiconductor device 100.

Differences between the semiconductor device 101 and the semiconductor device 100 will be described. No protruding portion 7 is formed at the other-side surface of the second lead frame 6. Over-chip joining members 4a joining the second lead frame 6 and the semiconductor elements 1 and 2 are low-strength members. In a cross-sectional shape obtained by cutting, at a plane perpendicular to the one-side surface of the heat spreader 3, a portion around the boundary between each over-chip joining member 4a and the mold resin 9 in the gap between the one-side surface of the corresponding semiconductor element 1, 2 and the other-side surface of the second lead frame 6, an angle (hereinafter, referred to as a joining angle 5) on the over-chip joining member 4a side out of two angles formed by the one-side surface of the semiconductor element 1, 2 and a straight line connecting an end point of a joining surface between the over-chip joining member 4a and the semiconductor element 1, 2 and an end point of a joining surface between the over-chip joining member 4a and the second lead frame 6, is an acute angle. The over-chip joining member 4a has a low rigidity.

The semiconductor device 101 is configured such that: the strength of the material of the over-chip joining member 4a is low; the over-chip joining member 4a has a low rigidity and an acute joining angle 5; and the semiconductor element 1, 2 and the like are sealed by the mold resin 9. This configuration causes reduction in a maximum stress that is generated at the maximum stress generation portion 12 of the semiconductor element 1, 2 by thermal deformation force generated to the semiconductor element 1, 2 owing to the difference in linear expansion coefficient among the semiconductor element 1, 2, the second lead frame 6, and the over-chip joining member 4a. Thus, occurrence of a crack in the semiconductor element 1, 2 is suppressed. However, the over-chip joining member 4a having a low strength, a low rigidity, and an acute joining angle 5 experiences occurrence of a crack at several hundreds of times of thermal cycle, whereby the life span of the over-chip joining member 4a is shortened.

<Configuration of Over-Chip Joining Member 4>

The configurations of the over-chip joining members 4 which are major parts of the present disclosure, will be described. The boundary between each over-chip joining member 4 and the mold resin 9 is present in the gap between the one-side surface of the corresponding semiconductor element 1, 2 and the other-side surface of the second lead frame 6. In the cross-sectional shape obtained by cutting a portion around the boundary at a plane perpendicular to the one-side surface of the heat spreader 3, a joining angle 5 on the over-chip joining member 4 side out of two angles formed by the one-side surface of the semiconductor element 1, 2 and a straight line connecting an end point of a joining surface between the over-chip joining member 4 and the semiconductor element 1, 2 and an end point of a joining surface between the over-chip joining member 4 and the second lead frame 6, is not smaller than 90° and not larger than 135°. In FIG. 2, a joining angle 5c is 90°, and a joining angle 5f is 135°. A joining angle 5d and a joining angle 5e are joining angles 5 that are within a range of not smaller than 90° and not larger than 135°. A joining angle 5a and a joining angle 5b are joining angles 5 that are smaller than 90°.

The reason for setting the joining angle 5 to be not smaller than 90° and not larger than 135° will be described with reference to FIG. 3 showing stresses generated at the time of thermal deformation of the semiconductor device 100. FIG. 3 is a diagram in which values of maximum stresses generated at the maximum stress generation portion 12 of each of the semiconductor elements 1 and 2 when the resin-sealed-type semiconductor device 100 shown in FIG. 2 repetitively experienced a temperature cycle from −45° C. to 150° C., are plotted with respect to joining angle 5. The linear expansion coefficient of the semiconductor element 1, 2 is 3 [ppm/K] to 5 [ppm/K], the linear expansion coefficient of the under-chip joining member is 18 [ppm/K] to 20 [ppm/K], the linear expansion coefficient of the over-chip joining member 4 is 21 [ppm/K] to 23 [ppm/K], the linear expansion coefficients of the heat spreader 3 and the second lead frame 6 are 16 [ppm/K] to 17 [ppm/K], and the linear expansion coefficient of the mold resin 9 is 15 [ppm/K] to 18 [ppm/K].

By comparison between the linear expansion coefficients of the materials, it is found that the linear expansion coefficient of the semiconductor element 1, 2 is lowest and the linear expansion coefficient of the over-chip joining member 4 is highest. The semiconductor element 1, 2 is a semiconductor material and has the lowest strength in the semiconductor device 100. Thus, it is necessary to reduce stress to be generated to the semiconductor element 1, 2. In the case where the semiconductor device 100 undergoes a temperature change from a high temperature to a low temperature, force is generated such that contraction occurs more at the over-chip joining member 4 than at the semiconductor element 1, 2. Consequently, a maximum stress is generated at the maximum stress generation portion 12 of the semiconductor element 1, 2.

In the case where the joining angle 5 of the over-chip joining member 4 is an acute angle, the joining area between the over-chip joining member 4 and the second lead frame 6 is small. Thus, in the over-chip joining member 4, the proportion of a force of deformation only in the shrinkage direction accounts for the majority. Meanwhile, in the case where the joining angle 5 of the over-chip joining member 4 is 90° to 135°, the joining area between the over-chip joining member 4 and the second lead frame 6 increases. Thus, in the over-chip joining member 4, the proportion of a force of deformation in the expansion direction increases. Consequently, the maximum stress at the maximum stress generation portion 12 of the semiconductor element 1, 2 is reduced. Meanwhile, in the case where the joining angle 5 of the over-chip joining member 4 is larger than 135°, the proportion of the force of deformation in the expansion direction excessively increases, and thus the maximum stress at the maximum stress generation portion 12 of the semiconductor element 1, 2 increases.

In the case where the semiconductor device 100 undergoes a temperature change from a low temperature to a high temperature, the correlation between the joining angle 5 and the maximum stress generated to the semiconductor element 1, 2 is unchanged although the direction of force generated in association with the temperature change becomes opposite. Therefore, it is possible to reduce the maximum stress at the maximum stress generation portion 12 of the semiconductor element 1, 2 without complicating and upsizing the structure of the second lead frame 6, by setting the joining angle 5 of the over-chip joining member 4 to be within the range of 90° to 135° while ensuring the rigidity of the over-chip joining member 4. If the maximum stress at the maximum stress generation portion 12 of the semiconductor element 1, 2 is reduced, it is possible to obtain a resin-sealed-type semiconductor device 100 that is downsized and requires reduced cost therefor while easily suppressing occurrence of a crack in the semiconductor element 1, 2.

In order to ensure the rigidity of the over-chip joining member 4, it is desirable that the thickness of the over-chip joining member 4 at the portion around the boundary between the over-chip joining member 4 and the mold resin 9 in the gap between the one-side surface of the semiconductor element 1, 2 and the other-side surface of the second lead frame 6, is 0.45 to 0.7 mm. In the present embodiment, the protruding portions 7 respectively protruding toward the semiconductor elements 1 and 2 are formed at the other-side surface of the second lead frame 6 in order to, from the over-chip joining member 4 formed of a solid having a fixed thickness (for example, 0.4 mm), set the thickness of the over-chip joining member 4 to be 0.45 to 0.7 mm and set the joining angle 5 thereof to be not smaller than 90° and not larger than 135°. Each protruding portion 7 presses the corresponding over-chip joining member 4 contiguous to the protruding portion 7 at the time of reflow heating in which the second lead frame 6 and the corresponding semiconductor element 1, 2 are joined, so that the portion of the over-chip joining member 4 that has been squeezed out by the pressing flows toward the end point of the joining surface between the over-chip joining member 4 and the second lead frame 6 at the portion around the boundary, whereby the joining angle 5 is set to be not smaller than 90° and not larger than 135°. The over-chip joining member 4 that has a high strength, a high rigidity, and a joining angle 5 within the range of 90° to 135° does not experience occurrence of a crack even at several thousands of times of thermal cycle, and thus the life span of the over-chip joining member 4 is elongated. Since the life span of the over-chip joining member 4 is elongated, the quality of the semiconductor device 100 becomes high, and the reliability of the semiconductor device 100 can be improved.

Although the shape of the protruding portion 7 is a rectangular parallelepiped in the present embodiment, the shape of the protruding portion 7 is not limited to a rectangular parallelepiped. If the thickness and the joining angle 5 of the over-chip joining member 4 at the boundary portion can be arbitrarily set, the configuration of the protruding portion 7 such as the shape of the protruding portion 7 and the number of protruding portions 7 may not be the configuration of the rectangular parallelepiped. In addition, although the example in which the protruding portion 7 is formed by embossing has been described, the method for forming the protruding portion 7 is not limited to embossing, and the protruding portion 7 may be formed by cutting. In the case of forming the protruding portion 7 by cutting, the step recess portion 8 may not be formed.

Although the portion connecting the end point of the joining surface between the over-chip joining member 4 and the semiconductor element 1, 2 and the end point of the joining surface between the over-chip joining member 4 and the second lead frame 6 is indicated by the straight line in the present embodiment, the portion connecting the end points to each other is not limited to a straight line. The portion connecting the end points to each other may be a curve. Also if the portion connecting the end points to each other is a curve, the maximum stress at the maximum stress generation portion 12 of the semiconductor element 1, 2 can be reduced by setting the joining angle 5 of the over-chip joining member 4 to be within the range of 90° to 135°.

In the present embodiment, at the boundary portion, the thickness of the over-chip joining member 4 is set to be 0.45 to 0.7 mm and the joining angle 5 thereof is set to be not smaller than 90° and not larger than 135°, by forming the protruding portion 7 at the other-side surface of the second lead frame 6. A high-strength member may be used as the over-chip joining member 4 in order to ensure the rigidity of the over-chip joining member 4. In the case of using a high-strength member, there is no need to increase the thickness thereof, and the thickness of the over-chip joining member 4 at the boundary portion may be 0.4 mm or smaller. Thus, the thickness can be made equal to or smaller than a thickness that allows a ribbon solder to be manufactured. Therefore, as shown in FIG. 5, no protruding portion 7 needs to be formed at the second lead frame 6. The joining angle 5 can be set to be within the appropriate range of 90° to 135° by adjusting the thickness and the size of the over-chip joining member 4 before melting. It is possible to reduce the maximum stress at the maximum stress generation portion 12 of the semiconductor element 1, 2 by setting the joining angle 5 of the over-chip joining member 4 to be within the range of 90° to 135° while ensuring the rigidity of the over-chip joining member 4.

<Method for Manufacturing Semiconductor Device 100>

A method for manufacturing the semiconductor device 100 will be described with reference to FIG. 4. The semiconductor device 100 is manufactured through a first step (S11) which is a die bonding step, a second step (S12) and a third step (S13) which are reflow steps, and a fourth step (S14) which is a transfer molding step.

The first step is a step of joining, via the under-chip joining members, the other-side surfaces of the semiconductor elements 1 and 2 formed in plate shapes to the one-side surface 3a of the heat spreader 3 formed in a plate shape. First, the under-chip joining members are disposed at an interval on the one-side surface 3a of the heat spreader 3, and the semiconductor element 1 which is a switching element and the semiconductor element 2 which is a rectification element are disposed on the under-chip joining members. Then, the under-chip joining members are melted, and the semiconductor elements 1 and 2 are joined to the one-side surface 3a of the heat spreader 3.

The second step is a step of joining the other-side surfaces of the first lead frames 10 and 11 to the one-side surface 3a of the heat spreader 3 via the lead joining members. First, the lead joining members are disposed on end portions on both sides of the one-side surface 3a of the heat spreader 3, and the first lead frames 10 and 11 are disposed on the lead joining members. Then, the lead joining members are melted by reflow heating, and, by subsequent cooling, the first lead frames 10 and 11 are joined to the one-side surface 3a of the heat spreader 3.

The third step is a step of joining the other-side surface of the second lead frame 6 to the one-side surfaces of the semiconductor elements 1 and 2 via the over-chip joining members 4. The over-chip joining members 4 each formed of a solid having a fixed thickness are interposed between the other-side surface of the second lead frame 6 and the one-side surfaces of the semiconductor elements 1 and 2. Then, the over-chip joining members 4 are melted by reflow heating. Then, the over-chip joining members 4 are cooled so that the other-side surface of the second lead frame 6 is joined to the one-side surfaces of the semiconductor elements 1 and 2 via the over-chip joining members 4. The melting and the subsequent cooling of the over-chip joining members 4 are performed such that in the cross-sectional shape obtained by cutting, at a plane perpendicular to the one-side surface of the heat spreader 3, the portion around the boundary that is between each over-chip joining member 4 and an outer side of the over-chip joining member 4 and that is present in the gap between the one-side surface of the corresponding semiconductor element 1, 2 and the other-side surface of the second lead frame 6, the angle on the over-chip joining member 4 side out of the two angles formed by the one-side surface of the semiconductor element 1, 2 and the straight line connecting the end point of the joining surface between the over-chip joining member 4 and the semiconductor element 1, 2 and the end point of the joining surface between the over-chip joining member 4 and the second lead frame 6, is set to be not smaller than 90° and not larger than 135°.

The over-chip joining members 4 are each, for example, a ribbon solder having a fixed thickness. Cost for solder can be reduced, by not using a solder that has a recess or a projection and thus does not have a fixed thickness, but using a ribbon solder having a fixed thickness. If the rigidities of the over-chip joining members 4 are low, cracks easily occur in the over-chip joining members 4. In order to ensure the rigidities of the over-chip joining members 4, the thicknesses of the over-chip joining members 4 each at a portion around the corresponding boundary are desirably 0.45 to 0.7 mm. A thickness that allows a ribbon solder to be manufactured is about 0.4 mm. Thus, the protruding portions 7 respectively protruding toward the semiconductor elements 1 and 2 are formed at the other-side surface of the second lead frame 6 in order to set the thicknesses of the over-chip joining members 4 to be 0.45 to 0.7 mm. Each over-chip joining member 4 contiguous to the corresponding protruding portion 7 is pressed at the time of reflow heating so that the portion of the over-chip joining member 4 that has been squeezed out by the pressing flows toward the end point of the joining surface between the over-chip joining member 4 and the second lead frame 6 at the portion around the boundary, whereby the thickness of the over-chip joining member 4 is set to be 0.45 to 0.7 mm, and the joining angle 5 on the over-chip joining member 4 side is set to be not smaller than 90° and not larger than 135°. By adjusting the size of the protruding portion 7 of the second lead frame 6 and the size of the over-chip joining member 4 before melting, the use amount of the over-chip joining member 4 can be made minimum, and the thickness and the joining angle 5 of the over-chip joining member 4 after melting can be arbitrarily set. With this configuration, the rigidity of the over-chip joining member 4 can be ensured, and occurrence of a crack in the semiconductor element 1, 2 can be suppressed.

The fourth step is a step of sealing the heat spreader 3, the semiconductor elements 1 and 2, the first lead frames 10 and 11, and the second lead frame 6 by the mold resin 9 which is a thermosetting resin such that portions of the first lead frames 10 and 11 and a portion of the second lead frame 6 are exposed to outside.

In the third step of the present embodiment, the other-side surface of the second lead frame 6 is joined to the one-side surfaces of the semiconductor elements 1 and 2 via the over-chip joining members 4. However, the third step is not limited thereto. The third step may be a step of mounting the second lead frame 6 to the semiconductor elements 1 and 2, then supplying, between the other-side surface of the second lead frame 6 and the one-side surfaces of the semiconductor elements 1 and 2, drops of the over-chip joining member 4 which has been melted by temperature increase, and performing cooling. This step causes elimination of the restriction that the protruding portions 7 of the second lead frame 6 are brought into contact with the over-chip joining members 4 before melting. Thus, the degree of freedom for the sizes of the protruding portions 7 of the second lead frame 6 increases. In addition, the supply amounts of the over-chip joining members 4 can be adjusted, and thus the use amounts of the over-chip joining members 4 can be further reduced.

It is noted that the use of the same type of, or the same, joining member as the lead joining member which is the second joining member and the over-chip joining member 4 which is the third joining member makes it possible to, without separately performing the second step (S12) and the third step (S13) which are reflow steps, perform all the joining related to the second step and the third step in a single reflow step (S10).

As described above, in the semiconductor device 100 according to the first embodiment, in the cross-sectional shape obtained by cutting the portion around the boundary between each over-chip joining member 4 and the mold resin 9 at a plane perpendicular to the one-side surface 3a of the heat spreader 3, the angle on the over-chip joining member 4 side out of the angles formed by the one-side surface of the corresponding semiconductor element 1, 2 and the straight line connecting the end point of the joining surface between the over-chip joining member 4 and the semiconductor element 1, 2 and the end point of the joining surface between the over-chip joining member 4 and the second lead frame 6, is not smaller than 90° and not larger than 135°. Thus, it is possible to reduce the maximum stress at the maximum stress generation portion 12 of the semiconductor element 1, 2 without complicating and upsizing the structure of the second lead frame 6. Therefore, it is possible to obtain a resin-sealed-type semiconductor device 100 that is downsized and requires reduced cost therefor while easily suppressing occurrence of a crack in the semiconductor element 1, 2. In addition, if each protruding portion 7 protruding toward the corresponding semiconductor element 1, 2 is formed at a portion of the other-side surface of the second lead frame 6 that is located inward of the portion around the boundary, the thickness of the over-chip joining member 4 at the boundary portion can be easily set to be 0.45 to 0.7 mm, and the joining angle 5 thereof can be easily set to be not smaller than 90° and not larger than 135°. In addition, the use amount of the over-chip joining member 4 can be made minimum, and thus a more inexpensive semiconductor device 100 can be provided. In addition, if the protruding portion 7 is formed at the second lead frame 6 by embossing, the protruding portion 7 can be easily formed at the other-side surface of the second lead frame 6.

In addition, in the case of the over-chip joining member 4 having a high strength, a high rigidity, and a joining angle 5 within the range of 90° to 135°, no crack occurs in the over-chip joining member 4 even at several thousands of times of thermal cycle, and thus the life span of the over-chip joining member 4 can be elongated. Since the life span of the over-chip joining member 4 is elongated, the quality of the semiconductor device 100 becomes high, and the reliability of the semiconductor device 100 can be improved.

In the method for manufacturing the semiconductor device 100 according to the first embodiment, the over-chip joining members 4 each formed of a solid having a fixed thickness are interposed between the other-side surface of the second lead frame 6 and the one-side surfaces of the semiconductor elements 1 and 2. Then, the over-chip joining members 4 are melted by reflow heating. Then, the over-chip joining members 4 are cooled so that the other-side surface of the second lead frame 6 is joined to the one-side surfaces of the semiconductor elements 1 and 2 via the over-chip joining members 4. Thus, cost for solder can be reduced, by not using a solder that has a recess or a projection and thus does not have a fixed thickness, but using a ribbon solder having a fixed thickness. In addition, each protruding portion 7 presses the corresponding over-chip joining member 4 contiguous to the protruding portion 7 at the time of reflow heating so that the portion of the over-chip joining member 4 that has been squeezed out by the pressing flows toward the end point of the joining surface between the over-chip joining member 4 and the second lead frame 6 at the portion around the boundary, whereby the joining angle 5 on the over-chip joining member 4 side is set to be not smaller than 90° and not larger than 135°. Therefore, the thickness of the over-chip joining member 4 at the boundary portion can be easily set to be 0.45 to 0.7 mm, and the joining angle 5 thereof can be easily set to be not smaller than 90° and not larger than 135°.

Second Embodiment

Figure 8:
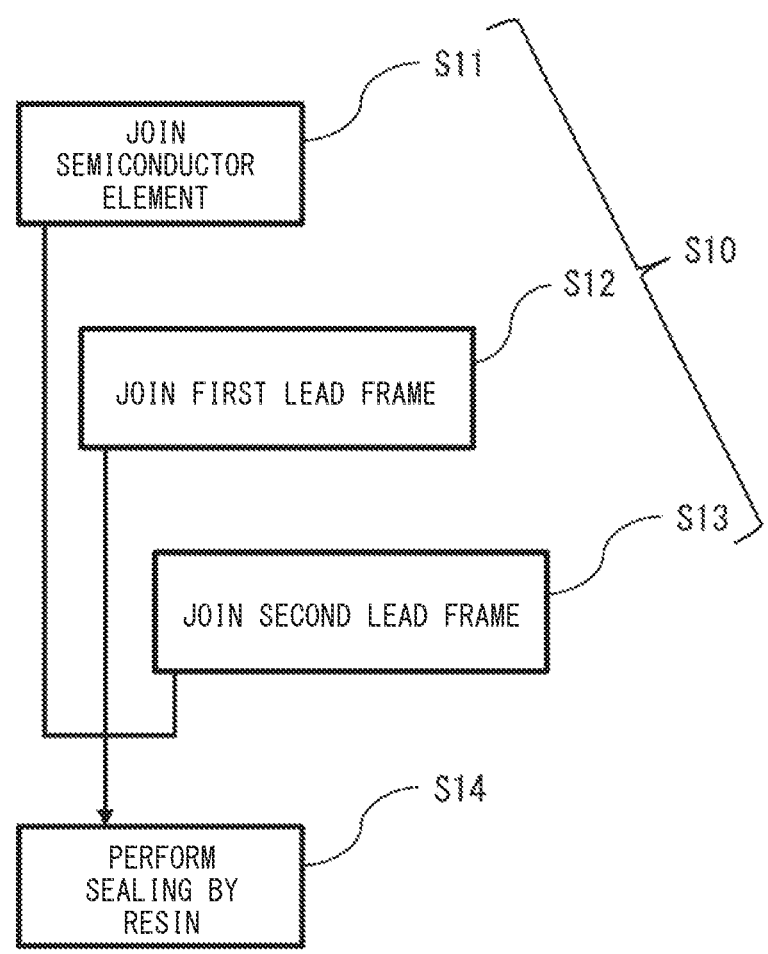
FIG. 8 is a diagram showing a manufacturing process for the semiconductor device according to a second embodiment.

A method for manufacturing the semiconductor device 100 according to a second embodiment will be described. FIG. 8 is a diagram showing a manufacturing process for the semiconductor device 100. In the method for manufacturing the semiconductor device 100 according to the second embodiment, the first step (S11), the second step (S12), and the third step (S13) are performed in a single step (S10).

Each under-chip joining member which is the first joining member, each lead joining member which is the second joining member, and each over-chip joining member 4 which is the third joining member, are joining members formed of the same type of, or the same, material. The joining members formed of the same type of, or the same, material are joining members formed of, for example, a solder. The use of the joining members formed of the same type of, or the same, material makes it possible to, without separately performing the first step (S11) which is a die bonding step and the second step (S12) and the third step (S13) which are reflow steps, perform all the joining related to the first step, the second step, and the third step in a single reflow step (S10).

As described above, in the method for manufacturing the semiconductor device 100 according to the second embodiment, the under-chip joining member, the lead joining member, and the over-chip joining member 4 are joining members formed of the same type of, or the same, material. Thus, the first step (S11), the second step (S12), and the third step (S13) can be performed in the single reflow step (S10), whereby the productivity for the semiconductor device 100 can be improved. In addition, since the productivity for the semiconductor device 100 is improved, a more inexpensive semiconductor device 100 can be provided.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent parts may be modified, added, or eliminated. At least one of the constituent parts mentioned in at least one of the preferred embodiments may be selected and combined with the constituent parts mentioned in another preferred embodiment.

DESCRIPTION OF THE REFERENCE CHARACTERS 1 semiconductor element
2 semiconductor element
3 heat spreader
3a one-side surface
3b other-side surface
4 over-chip joining member
4a over-chip joining member
5 joining angle
6 second lead frame
7 protruding portion
8 step recess portion
9 mold resin
10 first lead frame
11 first lead frame
12 maximum stress generation portion
100 semiconductor device
101 semiconductor device

What is claimed is:

1. A semiconductor device comprising:
a heat spreader formed in a plate shape;
a semiconductor element formed in a plate shape and joined, to a one-side surface of the heat spreader, at an other-side surface of the semiconductor element via a first joining member;
a first lead frame joined, at an other-side surface thereof, to the one-side surface of the heat spreader via a second joining member;
a second lead frame joined, at an other-side surface thereof, to a one-side surface of the semiconductor element via a third joining member; and
a mold resin sealing the heat spreader, the semiconductor element, the first lead frame, and the second lead frame such that a portion of the first lead frame and a portion of the second lead frame are exposed to outside, wherein
a boundary between the third joining member and the mold resin is present in a gap between the one-side surface of the semiconductor element and the other-side surface of the second lead frame, and
in a cross-sectional shape obtained by cutting a portion around the boundary at a plane perpendicular to the one-side surface of the heat spreader, an angle on the third joining member side out of two angles formed by the one-side surface of the semiconductor element and a straight line connecting an end point of a joining surface between the third joining member and the semiconductor element and an end point of a joining surface between the third joining member and the second lead frame, is not smaller than 90° and not larger than 135°.

2. The semiconductor device according to claim 1, wherein a protruding portion protruding toward the semiconductor element is formed at a portion of the other-side surface of the second lead frame that is located inward of the portion around the boundary.

3. The semiconductor device of claim 1, wherein the angle which is not smaller than 90° and is not larger than 135° is about 90°.

4. The semiconductor device of claim 2, wherein the protruding portion is a parallelepiped, and the third joining member extends beyond an endpoint of the protruding portion in a direction toward a maximum stress generation portion of the semiconductor element.

5. A semiconductor device manufacturing method comprising:
a first step of joining, to a one-side surface of a heat spreader formed in a plate shape, an other-side surface of a semiconductor element formed in a plate shape, the joining being performed via a first joining member;
a second step of joining an other-side surface of a first lead frame to the one-side surface of the heat spreader via a second joining member;
a third step of interposing a third joining member formed of a solid having a fixed thickness between an other-side surface of a second lead frame and a one-side surface of the semiconductor element, then melting the third joining member by reflow heating, and then cooling the third joining member, to join the other-side surface of the second lead frame to the one-side surface of the semiconductor element via the third joining member, the melting and the subsequent cooling of the third joining member being performed such that in a cross-sectional shape obtained by cutting, at a plane perpendicular to the one-side surface of the heat spreader, a portion around a boundary that is between the third joining member and an outer side of the third joining member and that is present in a gap between the one-side surface of the semiconductor element and the other-side surface of the second lead frame, an angle on the third joining member side out of two angles formed by the one-side surface of the semiconductor element and a straight line connecting an end point of a joining surface between the third joining member and the semiconductor element and an end point of a joining surface between the third joining member and the second lead frame, is set to be not smaller than 90° and not larger than 135°; and a fourth step of sealing the heat spreader, the semiconductor element, the first lead frame, and the second lead frame by a mold resin such that a portion of the first lead frame and a portion of the second lead frame are exposed to outside.

6. The semiconductor device manufacturing method according to claim 5, wherein a protruding portion formed, so as to protrude toward the semiconductor element, at a portion of the other-side surface of the second lead frame that is located inward of the portion around the boundary presses the third joining member contiguous to the protruding portion at a time of the reflow heating so that a portion of the third joining member that has been squeezed out by the pressing flows toward the end point of the joining surface between the third joining member and the second lead frame at the portion around the boundary, whereby the angle on the third joining member side is set to be not smaller than 90° and not larger than 135°.

7. The semiconductor device manufacturing method according to claim 5, wherein the second joining member and the third joining member are joining members formed of a same type of, or a same, material, and the second step and the third step are performed in a single step.

8. The semiconductor device manufacturing method according to claim 6, wherein the second joining member and the third joining member are joining members formed of a same type of, or a same, material, and the second step and the third step are performed in a single step.

9. The semiconductor device manufacturing method according to claim 5, wherein the first joining member, the second joining member, and the third joining member are joining members formed of a same material, and the first step, the second step, and the third step are performed in a single step.

10. The semiconductor device manufacturing method according to claim 6, wherein the first joining member, the second joining member, and the third joining member are joining members formed of a same material, and the first step, the second step, and the third step are performed in a single step.

* * * * *